(12) United States Patent
Morita et al.

(10) Patent No.: US 8,310,254 B2
(45) Date of Patent: Nov. 13, 2012

(54) PROBE PIN

(75) Inventors: Naoki Morita, Isehara (JP); Tatsuya Yanagidate, Isehara (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 284 days.

(21) Appl. No.: 12/602,899

(22) PCT Filed: Jun. 4, 2008

(86) PCT No.: PCT/JP2008/060268
§ 371 (c)(1),
(2), (4) Date: Dec. 3, 2009

(87) PCT Pub. No.: WO2008/149886
PCT Pub. Date: Dec. 11, 2008

(65) Prior Publication Data
US 2010/0176833 A1 Jul. 15, 2010

(30) Foreign Application Priority Data
Jun. 6, 2007 (JP) ................. P2007-150737

(51) Int. Cl.
*G01R 31/20* (2006.01)
*G01R 1/067* (2006.01)

(52) U.S. Cl. ............... 324/754.01; 324/755.01

(58) Field of Classification Search ............ 324/754.01–754.03, 755.01–755.11, 762.01–762.09, 72.5; 257/48; 438/14–18
See application file for complete search history.

(56) References Cited

U.S. PATENT DOCUMENTS

| 3,767,391 A | 10/1973 | Tuccillo et al. .................. 75/134 |
| 6,517,955 B1 * | 2/2003 | Takada et al. .................. 428/659 |
| 7,459,922 B2 * | 12/2008 | Kazama .................. 324/755.05 |

FOREIGN PATENT DOCUMENTS

| JP | 49-46208 | 12/1974 |
| JP | 05-154719 | 6/1993 |
| JP | 10-038922 | 2/1998 |
| JP | 2004-093355 | 3/2004 |

\* cited by examiner

*Primary Examiner* — Tung X Nguyen
(74) *Attorney, Agent, or Firm* — Roberts & Roberts, LLP

(57) ABSTRACT

There is provided a material having an excellent conductivity and oxidation resistance as well as a sufficient hardness for probe pins. The present invention provides a probe pin material including Au, Ag, Pd and Cu, wherein the concentration of Au is 40 to 55% by weight, the concentration of Ag is 15 to 30% by weight and the total concentration of Pd and Cu is 15 to 40% by weight. This material can further include 0.6 to 5% by weight of any one element from among Ni, Zn and Co. Furthermore, this alloy can be precipitation-hardened by being heated at 300 to 500° C., enabling provision of a material having a higher hardness.

2 Claims, 2 Drawing Sheets

PROBE PIN

TECHNICAL FIELD

The present invention relates to a material for probe pins for testing the electrical properties of, e.g., a semiconductor integrated circuit.

BACKGROUND ART

When conducting a test of the electrical properties of a semiconductor integrated circuit, a liquid-crystal display device or the like, formed on a wafer, a probe card in which a plurality of probe pins are arranged is used. Typically, this test is conducted by making a plurality of electrode pads on a semiconductor integrated circuit element, a liquid-crystal display device or the like, which is a test target, formed on a wafer be in contact with probe pins.

Examples of conventionally-used probe pin materials include those using beryllium copper (Be—Cu), phosphor bronze (Cu—Sn—P) or tungsten (W), and an alloy formed by adding, e.g., sliver (Ag) to palladium (Pd).

Patent Document 1: Japanese Patent Laid-Open No. 10-038922

Patent Document 2: Japanese Patent Laid-Open No. 05-154719

Patent Document 3: Japanese Patent Laid-Open No. 2004-093355

DISCLOSURE OF THE INVENTION

Problems to be Solved by the Invention

A probe pin material is required to have a high hardness to prevent abrasion caused by repetitive tests, which are conducted millions of times, and also required to have an elasticity enabling maintenance of stable contact with electrode pads (high spring property). Also, when probe pins themselves are oxidized, a generated oxidized coating film may contaminate the test target, and thus, the material is also required to have oxidation resistance. Furthermore, since probe pins are used in electrical property tests, the material is required to be a favorable conductive material with a low specific resistance.

There are few conventional probe pin materials having all the aforementioned required properties. In other words, a copper alloy or tungsten is suitable in terms of mechanical properties, but is a material that is relatively easily oxidized, and has a tendency to cause an oxide thereof to remain on the text target as a residue. If a test is continued in this condition, a poor conduction occurs, disabling provision of accurate measurement values.

Meanwhile, a palladium alloy is favorable in terms of oxidation resistance property, but is somewhat inferior in terms of, e.g., hardness. On this point, semiconductor integrated circuits, etc., in recent years tend to have a narrower pitch of electrode pads as a result of density growth, and in order to response to this tendency, there is a demand to provide fine-diameter probe pins. In order to meet this demand, a material having a sufficient hardness for a probe pin material is needed.

The present invention has been made in view of the above circumstances and provides a material having conductivity and oxidation resistance as well as a sufficient hardness for probe pins.

Means for Solving the Problems

In order to solve the above problems, the present inventors conducted diligent study and found an alloy material for probe pins, which contains gold (Au), as its main component, with metal elements for securing hardness and conductivity added thereto.

In other words, the present invention provides a probe pin that is repeatedly made into contact with an electrode pad from among a plurality of electrode pads on a semiconductor integrated circuit element or a liquid-crystal display device to test an electrical property of the semiconductor integrated circuit element or the liquid-crystal display device, the probe pin comprising a material including Au, Ag, Pd and Cu, wherein the material is formed by heating an alloy with an Au concentration of 40 to 55% by weight, an Ag concentration of 15 to 30% by weight and a total Pd and Cu concentration of 15 to 40% by weight at 300 to 500° C. to precipitation-harden the alloy.

Although Au is a good conductor and excellent in oxidation resistance, it is soft and inferior in hardness. In the present invention, Ag, Pd and Cu, which have the following effects, are added to Au as alloy elements to balance the hardness, conductivity and oxidation resistance.

Here, Pd and Cu have the effect of enhancing the hardness of the alloy, but are different from each other in their effects imposed on the conductivity: Pd enhances the specific resistance while Cu lowers the specific resistance. Also, Ag less affects the hardness and is added to lower the specific resistance. In other words, Ag is added to compensate for a rise in specific resistance caused due to a decrease in Au concentration as a result of addition of Pd.

In views of the aforementioned effects of the elements, a composition satisfying the hardness and specific resistance for use as probe pins is one having an Au concentration of 40 to 55% by weight, an Ag concentration of 15 to 30% by weight, with a Pd and Cu concentration of 15 to 40% by weight, which is the total concentration of the two elements, added thereto. Also, a more preferable composition is one having an Au concentration of 40 to 50% by weight, an Ag concentration of 15 to 30% by weight, and a total Pd and Cu concentration of 30 to 40% by weight.

The alloy according to the present invention may further comprise 0.6 to 5% by weight of at least any one element from among Ni, Zn and Co. These elements are effective in enhancing the hardness. As to the concentrations of these additive elements, an addition with a concentration of less than 0.6% by weight provides no effects, while an addition with a concentration exceeding 5% by weight provides a significant increase in specific resistance. Respective favorable concentrations of these additive elements are 0.6 to 1% by weight, and a favorable material composition in this case is one having an Au concentration of 40 to 50% by weight, an Ag concentration of 15 to 30% by weight, and a total Pd and Cu concentration of 30 to 40% by weight, in which a total concentration of Ni, Zn and Co is 1 to 3% by weight.

Although the above-described alloy material for probe pins has a sufficient hardness as it is cast or as it is shaped, the hardness can further be enhanced by heat-treating the alloy material at 300 to 500° C. to precipitation-harden the alloy. For the heat treatment temperature, no hardness increase can be seen at less than 300° C., and upon performing heat treatment at a temperature exceeding 500° C., the alloy material softens, and accordingly, the aforementioned temperature range is employed. For the time period of heat treatment, it is preferable to set time causing sufficient precipitation hardening in the material. On this point, the heat treatment may be conducted after processing the alloy material to form wires for probe pins, and if the material is in the state of ultrafine wires after the processing (with a wire diameter of 0.05 to 0.5 mm), the heat treatment time may be around 10 to 20 seconds.

Also, for heat treatment performed after processing the material to form ultrafine wires, in many cases, the fine wires formed as a result of the processing are fed to a heat treatment device at a fixed speed to to subjected to a heat treatment, and then they are rolled up. The feeding speed in such case is preferably 4 to 6 m/min. If the feeding speed is too slow (i.e., the heat treatment time becomes long), problems may occur in that, e.g., the hardness after heat treatment is adversely lowered or fine wires after heat treatment stick together. The heat treatment may be performed before processing the material to form wires for probe pins. Also, the heat treatment atmosphere is preferably a reducing atmosphere (for example, a nitrogen-hydrogen mixed gas atmosphere).

A preferable hardness of an alloy material according to the present invention is within a range of 280 to 350 Hv after the processing. Although the hardness varies depending on the processing ratio of the alloy after dissolution and casting, it is typically 60 to 99.9%. Also, as a result of heat-treating a material having such hardness, the hardness is raised to 300 to 450 Hv.

When the material according to the present invention is formed into probe pins, the probe pins are preferably those consisting of an alloy material in its entirety, i.e., those configured as what is called a solid material. These probe pins have a sufficient hardness and conductivity, and also have an excellent oxidation resistance.

BEST MODE FOR CARRYING OUT THE INVENTION

Figure 1:
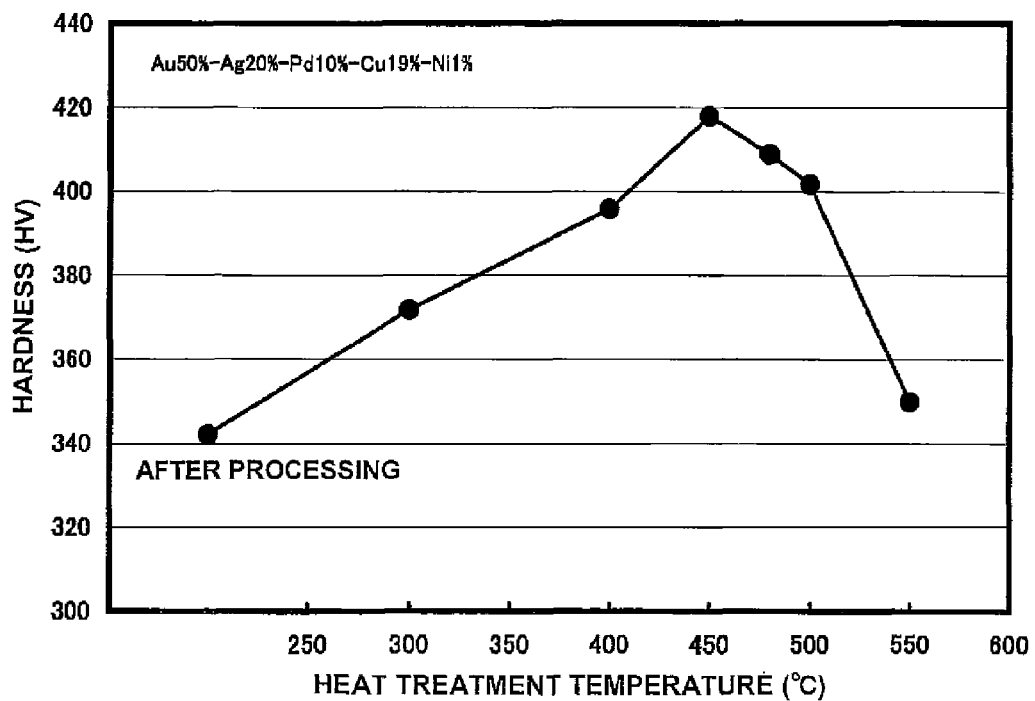
FIG. 1 is a diagram illustrating a relationship between the heat treatment temperature and the hardness of an alloy according to example 2.

Hereinafter, preferable examples of the present invention will be described together with comparative examples. In this embodiment, alloys with various compositions were manufactured, and measured and evaluated in terms of hardness and specific resistance. Also, heat treatment is performed to study occurrence or non-occurrence of hardening.

For samples, metals, which are raw materials, were vacuum-melted to form an ingot (dimensions: 40 mm in diameter×6 mm), and this ingot was rolled so as to have a cross-sectional surface reduction percentage of around 80%. The thickness after the rolling was around 1.2 mm. The rolled material was cut to obtain a test piece having 10 mm in length×1.0 mm in width, and the piece was embedded in a resin and ground to obtain a sample for hardness measurement. Also, another test piece having 60 mm in length×10 mm in width is cut out of the rolled material, and this test piece was used as a sample for specific resistance measurement.

Hardness measurement was performed with a Vickers hardness tester. The measurement conditions were a load of 100 gf and indentation time of 10 seconds. Also, for specific resistance measurement, an electrical resistance was measured with an electrical resistance meter and a specific resistance was calculated from the cross-sectional area and the length of the sample.

Then, the sample after hardness measurement was taken out of the resin, and this sample and the sample after specific resistance measurement were heat-treated under a nitrogen atmosphere at 450° C. for 30 minutes to precipitation-harden the samples. This heat treatment time was determined in consideration of the sizes of the samples. Subsequently, in such a manner as described above, the hardness and specific resistance measurements of the samples after heat treatment were performed. Table 1 indicates the evaluation results of the above.

TABLE 1

| | Composition (wt %) | | | | | | | Hardness (Hv) | | Specific resistance ($\mu\Omega$cm) | |
|---|---|---|---|---|---|---|---|---|---|---|---|
| | Au | Ag | Pd | Cu | Ni | Co | Zn | After processing | After heat treatment | After processing | After heat treatment |
| Ex. 1 | 40 | 20 | 20 | 20 | — | — | — | 288 | 385 | 27.3 | 28.92 |
| Ex. 2 | 50 | 20 | 10 | 19 | 1 | — | — | 280 | 353 | 19.89 | 19.37 |
| Ex. 3 | 50 | 20 | 10 | 19 | — | 1 | — | 291 | 312 | 26.68 | 27.66 |
| Ex. 4 | 50 | 20 | 10 | 19 | — | — | 1 | 290 | 319 | 22.72 | 18.28 |
| Ex. 5 | 47.5 | 19 | 9.5 | 19 | 5 | — | — | 307 | 322 | 32.22 | 26.48 |
| Com. Ex. 1 | 40 | 40 | 10 | 10 | — | — | — | 239 | 228 | 19.13 | 18.69 |
| Com. Ex. 2 | 65 | 20 | 5 | 10 | — | — | — | 238 | 245 | 18.39 | 18.69 |

* The shaded parts in the comparative examples represent elements excluded from the range of the compositions of the present invention.

From Table 1, the samples in examples 1 to 5 all exhibited a hardness of no less than 280 HV after the processing, and some of them exhibited a hardness exceeding 300 HV by means of heat treatment. Also, for specific resistance, when the acceptability criterion was set to 30 $\mu\Omega$ cm (average value of conventional products), the samples in the respective examples did not largely exceed the criterion, and thus, were basically satisfiable. Meanwhile, in the comparative examples, although the samples exhibited a sufficiently-low specific resistance, they were inferior in terms of hardness. Also, it turned out that a hardness increase effect by means of heat treatment cannot be expected in the samples according to the comparative examples.

Next, existence or non-existence of precipitation hardening depending on the heat treatment temperature was studied. Here, an ingot formed by dissolving and casting an alloy having a composition similar to that of example 2 was subjected to rolling processing at a processing ratio of 99.8%, and then, this rolled material was heat-treated in a nitrogen atmosphere at 300 to 550° C. The heat treatment was performed by making the rolled material pass through an electric furnace with a length of 1.8 m at a feeding speed of 5 m/min. After the heat treatment, a sample with 0.1 mm in diameter×10 mm in length was cut out of the rolled material, embedded in a resin and then ground, and a hardness measurement was conducted. For the hardness measurement, conditions similar to those described above were employed. FIG. 1 indicates the results.

As can be seen from FIG. 1, although an increase in hardness can be seen by performing heat treatment, there can be seen the hardness tends to lower once the temperature reaches no less than 450° C., and at 550° C., the sample exhibits a hardness similar to that after the processing. Accordingly, it turns out that, even though the hardness is raised by means of heat treatment, it is proper to set the temperature to not more than 500° C.

Furthermore, in addition to the study of the above-described material properties, property evaluation of probe pins was also conducted. Using probe pins formed by arbitrarily selecting fine wires from the examples and the comparative examples, and subjecting them to cutting and end treatment, their contamination resistance property and electrical contact stability against repetitive contacts were studied. Contamination resistance property is an important property because probe pins, as described above, have problems in contamination, e.g., formation of an oxide coating film on the probe pins themselves due to repetitive use, and adhesion of foreign substances from the counterpart of the contact. Furthermore, in an electrical property test, probe pins having a high electrical contact stability enable reduction in the test time because the electrical resistance is promptly stabilized. In particular, in many cases, a multitude of probe pins are used in one electrical property test, and thus, a high electrical contact stability per probe pin is required. Contamination resistance property and electrical contact stability study was also conducted for conventional materials such as tungsten.

Figure 2:
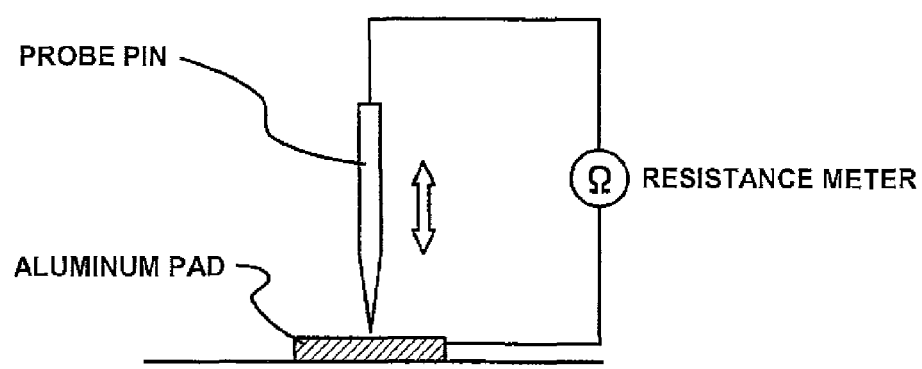
FIG. 2 is a diagram illustrating a configuration of a simulation test device for contamination resistance property evaluation.
Figure 3:
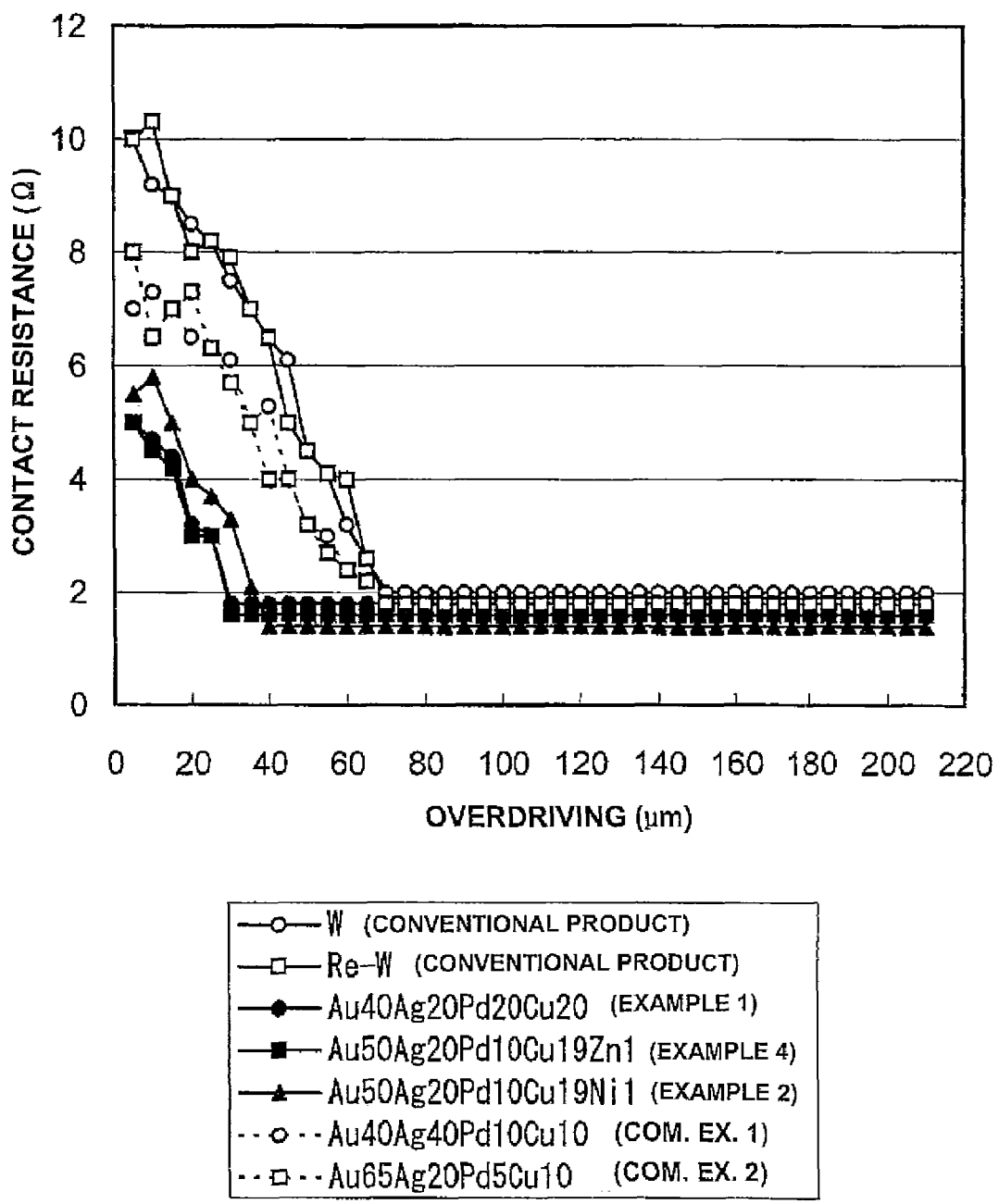
FIG. 3 illustrates evaluation results of electrical contact stability of probe pins using wires according to examples and comparative examples.

This contamination resistance property and electrical contact stability study was conducted using the simulation test device illustrated in FIG. 2. This test is conducted by setting a manufactured probe pin in the device and measuring the electrical resistance of the probe pin while subjecting the probe pin to repetitive contacts under the following conditions. In a contamination resistance property test, the electrical resistance increases as the number of contacts increases, and the number of contacts until the time requiring cleaning was measured, with the premise that the time when the contact resistance exceeded 5Ω was the time requiring cleaning. Table 2 indicates the measurement results of the contact counts until the contact resistance exceeded 5Ω. Meanwhile, for the electrical contact property, the pressing amounts (overdrive amount) of the probe pin on an aluminum pad from the start of the measurement until stabilization of the contact resistance in the above-described contamination resistance property evaluation were studied. FIG. 3 illustrates the measurement results of electrical contact properties.

Test Conditions
Contact counterpart: pad made of gold
Contact pressure: 8 g/1 pin
Applied current: 100 mmA/1 pin

TABLE 2

| | Constituent material | Contact count |
|---|---|---|
| Conventional products | W | 10000 times |
| | Re—W alloy | 10000 times |
| Present invention | Au40Ag20Pd20Cu20 (Example 1) | 800000 times |
| | Au50Ag20Pd10Cu19Zn1 (Example 4) | 860000 times |
| | Au50Ag20Pd10Cu19Ni1 (Example 2) | 900000 times |
| Comparative Examples | Au40Ag40Pd10Cu10 (Comparative Example 1) | 400000 times |
| | Au65Ag20Pd5Cu10 (Comparative Example 2) | 450000 times |

From Table 2, with probe pins made from the materials according to the examples, the number of contacts until cleaning becomes necessary is no less than 80 times that of tungsten, which is a conventional material, and thus, it was confirmed that they have a high contamination resistance property. On this point, it turned out that in comparative examples 1 and 2, although a contamination resistance property improvement effect can be seen compared to the conventional products, they are somewhat inferior in the number of contacts until cleaning becomes necessary compared to those of the examples. From the simulation test results, the high contamination resistance property of probe pins according to the present invention was confirmed, and this leads to elimination of the need for frequent cleaning of probe pins in an actual test device (reduction in cleaning frequency), largely reducing the test time in total.

Also, from FIG. 3, the probe pin including the material according to each of the examples exhibits an overdrive amount that is approximately half compared to a probe pin including tungsten, which is a conventional material, or a material according to each of the comparative examples, and thus, have a stable contact resistance. Accordingly, it was confirmed that they have a high electrical contact stability.

INDUSTRIAL APPLICABILITY

As described above, the probe pin material according to the present invention has a high hardness and a low specific resistance, and is excellent in conductivity. Also, it includes precious metals as its main components, and thus, also has an excellent oxidation resistance. The present invention enables provision of probe pins that can be used stably for a long time and will not contaminate a test target.

The invention claimed is:

1. A probe pin that is repeatedly made into contact with an electrode pad from among a plurality of electrode pads on a semiconductor integrated circuit element or a liquid-crystal display device to test an electrical property of the semiconductor integrated circuit element or the liquid-crystal display device, the probe pin being formed of a material consisting essentially of Au, Ag, Pd and Cu, wherein the material is formed by heating an alloy with an Au concentration of 40 to 55% by weight, an Ag concentration of 15 to 30% by weight and a total Pd and Cu concentration of 15 to 40% by weight at 300 to 500 ° C. to precipitation-harden the alloy to a hardness of 300 to 450 Hv.

2. The probe pin according to claim 1, wherein the precipitation-hardened alloy further consists essentially of 0.6 to 5% by weight of at least any one element from among Ni, Zn and Co.

* * * * *